(12) United States Patent
Ko et al.

(10) Patent No.: US 11,496,840 B2
(45) Date of Patent: Nov. 8, 2022

(54) SPEAKER UNIT FOR EARPHONE

(71) Applicant: ALMUS Corp., Chungcheongnam-do (KR)

(72) Inventors: Ju Heon Ko, Gyeonggi-do (KR); Jong Won Lee, Incheon (KR); Byung Il Min, Gyeonggi-do (KR); Yun Uk Ha, Incheon (KR); Jeong Kwon Park, Gyeonggi-do (KR)

(73) Assignee: ALMUS Corp., Chungcheongnam-do (KR)

( * ) Notice: Subject to any disclaimer, the term of this patent is extended or adjusted under 35 U.S.C. 154(b) by 80 days.

(21) Appl. No.: 17/178,367

(22) Filed: Feb. 18, 2021

(65) Prior Publication Data

US 2022/0210570 A1  Jun. 30, 2022

(30) Foreign Application Priority Data

Dec. 24, 2020 (KR) .................. 10-2020-0182750

(51) Int. Cl.
```
H04R 9/06    (2006.01)
H05K 1/02    (2006.01)
H05K 1/18    (2006.01)
H04R 9/02    (2006.01)
H04R 7/12    (2006.01)
H04R 7/18    (2006.01)
```
(Continued)

(52) U.S. Cl.
CPC ............. *H04R 9/06* (2013.01); *H04R 1/1075* (2013.01); *H04R 7/127* (2013.01); *H04R 7/18* (2013.01); *H04R 9/025* (2013.01); *H04R 9/046* (2013.01); *H05K 1/0277* (2013.01); *H05K 1/181* (2013.01); *H04R 2400/11* (2013.01); *H04R 2460/11* (2013.01); *H05K 2201/10083* (2013.01)

(58) Field of Classification Search
CPC ........ H04R 9/06; H04R 1/1075; H04R 7/127; H04R 7/18; H04R 9/025; H04R 9/046; H04R 2400/11; H04R 2460/11; H05K 1/0277; H05K 1/181; H05K 2201/10083
USPC ................................................. 381/335, 336
See application file for complete search history.

(56) References Cited

U.S. PATENT DOCUMENTS

2014/0169593 A1* 6/2014 Kwon .................... H04R 9/043
                                                     381/185
2021/0383785 A1* 12/2021 Sibbald ............ G10K 11/17815

FOREIGN PATENT DOCUMENTS

KR    10-2008-0095962 A    10/2008
KR    10-1200435 B1        11/2012

OTHER PUBLICATIONS

Korean Office Action from corresponding Korean Patent Application No. 10-2020-0182750, dated Dec. 23, 2021.

* cited by examiner

*Primary Examiner* — Ammar T Hamid
(74) *Attorney, Agent, or Firm* — Harness, Dickey & Pierce, P.L.C.

(57) ABSTRACT

Disclosed is a speaker unit for an earphone. The speaker unit includes a frame, a magnet, a plate fixed to the frame and coming into contact with the magnet, a diaphragm, a coil disposed to be radially overlapped with the magnet and the plate, and a flexible printed circuit board (FPCB). Here, the FPCB includes a first area fixed to the diaphragm, a second area connected to the frame, and a plurality of third areas configured to connect the first area to the second area. The third area includes a contact point connected to the coil. The third areas each include at least one bent area, and a space is disposed between the third areas adjacent to each other.

10 Claims, 18 Drawing Sheets

(51) Int. Cl.
*H04R 1/10* (2006.01)
*H04R 9/04* (2006.01)

SPEAKER UNIT FOR EARPHONE

CROSS-REFERENCE TO RELATED APPLICATION

This application claims priority to and the benefit of Korean Patent Application No. 10-2020-0182750, filed on Dec. 24, 2020, the disclosure of which is incorporated herein by reference in its entirety.

FIELD

Embodiments relate to a speaker unit for an earphone.

BACKGROUND

An earphone includes a speaker unit which generates a sound wave in a housing.

The speaker unit may include a frame, a diaphragm, a coil fixed to the diaphragm, and a substrate. The substrate is connected to the coil and supplies an electrical signal to the coil. The substrate may be disposed on the frame. A pad thermally fused with a lead wire of the coil is attached to the substrate. The substrate requires a radially wide width of the earphone to secure a space to which the pad is attached. Particularly, in the case of an earphone including a speaker unit configured to emit a sound in a high-pitched range and a speaker unit configured to emit a sound in a low-pitched range, the number of pads increases so that a wide width of a substrate is required.

Accordingly, a backup plate configured to support the substrate requires a radially wide width corresponding to a size of the substrate. However, in the earphone, since a radial size of a diaphragm is inevitably restricted due to a space occupied by the substrate and the backup plate supporting the substrate, there are limitations in a volume and a reproduction area of a sound.

SUMMARY

The present invention is directed to providing a speaker unit configured to secure a size of a diaphragm so as to increase a volume and a reproduction range of a sound.

Aspects of the present invention are not limited to the above-stated aspects and other unstated aspects of the present invention will be understood by those skilled in the art from the following description.

According to an aspect of the present invention, there is provided a speaker unit for an earphone. The speaker unit includes a frame, a magnet, a plate fixed to the frame and coming into contact with the magnet, a diaphragm, a coil disposed to be radially overlapped with the magnet and the plate, and a flexible printed circuit board (FPCB). Here, the FPCB includes a first area fixed to the diaphragm, a second area connected to the frame, and a plurality of third areas configured to connect the first area to the second area. The third area includes a contact point connected to the coil. The third areas each include at least one bent area, and a space is disposed between the third areas adjacent to each other.

The plate may include a first plate coming into contact with one side of the magnet and a second plate coming into contact with another side of the magnet. The diaphragm may include a first diaphragm disposed in front of the first plate and a second diaphragm disposed in the rear of the second plate. The coil may include a first coil and a second coil. The first coil may be disposed to be radially overlapped with the magnet and the first plate. The second coil may be disposed to be radially overlapped with the magnet and the second plate. The FPCB may include a first FPCB and a second FPCB. The first area of the first FPCB may be connected to the first coil, and the first area of the second FPCB may be connected to the second coil. The first FPCB may support the first diaphragm to be movable, and the second FPCB may support the second diaphragm to be movable.

The first area of the first FPCB may come into contact with the first diaphragm and the first coil, and the first area of the second FPCB may come into contact with the second coil.

The first area of the first FPCB may be fixed to a dome portion of the first diaphragm, and a part of the second area of the first FPCB may be fixed to an edge portion of the first diaphragm. The first area of the second FPCB may be fixed to a dome portion of the second diaphragm, and the second area of the second FPCB may be fixed to a terminal disposed on the frame.

A connection position between the third area and the first area may differ from a connection position between the third area and the second area in a circumferential direction.

The first area and the second area may be disposed to be overlapped with the diaphragm in a front-rear direction.

The speaker unit may further include a terminal disposed on the frame and configured to electrically connect the first FPCB to the second FPCB.

The contact point may include a first contact point and a second contact point. The first contact point may be disposed in the third area of the first FPCB and connected to a lead wire of the first coil. The second contact point may be disposed in the third area of the second FPCB and connected to a lead wire of the second coil.

A connection area between the first FPCB and the terminal may be radially disposed outside the first diaphragm.

The first plate may include a base including a hole in which the first coil is located, a first extension portion radially extending from the base, and a second extension portion radially extending from the first extension portion. Here, the first extension portion may be disposed to be stepwise from the base and may come into contact with the second area of the first FPCB. The second extension portion may be disposed to be stepwise from the first extension portion and disposed outside the second area of the first FPCB to come into contact with the frame.

The speaker unit may further include a backup plate stacked on the frame. The second area of the second FPCB may be stacked and disposed on the backup plate. The frame may include a rib protruding from a top end thereof, and the rib may be disposed to be radially overlapped with the backup plate and the second FPCB.

The frame may include a first accommodation portion and a second accommodation portion which are disposed to be spaced apart along a circumferential direction and a third accommodation portion disposed between the first accommodation portion and the second accommodation portion. The magnet may be disposed on each of the first accommodation portion and the second accommodation portion. The second area and the third areas of the second FPCB may be disposed on the third accommodation portion.

The frame may include a hole passing through an inner surface and an outer surface of the frame. The hole may allow the third areas to communicate with an external space of the frame so as to form a path for barometric equilibrium.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION

The aspects, particular advantages, and novel features of the present invention will become apparent from the following detailed description of exemplary embodiments with reference to the attached drawings. Also, the terms used in the specification and the claims should not be limited to general or lexical meanings and should be construed as meanings and concepts coinciding with the technical concept of the present invention on the basis of a principle in which the inventor can appropriately define the concept of the terms to describe the invention in the best manner. Also, in describing the present invention, a detailed description of well-known functions or components of the related art will be omitted when it is deemed to obscure the essence of the present invention.

Hereinafter, a speaker unit according to an embodiment will be described in detail with reference to the attached drawings.

Figure 1:
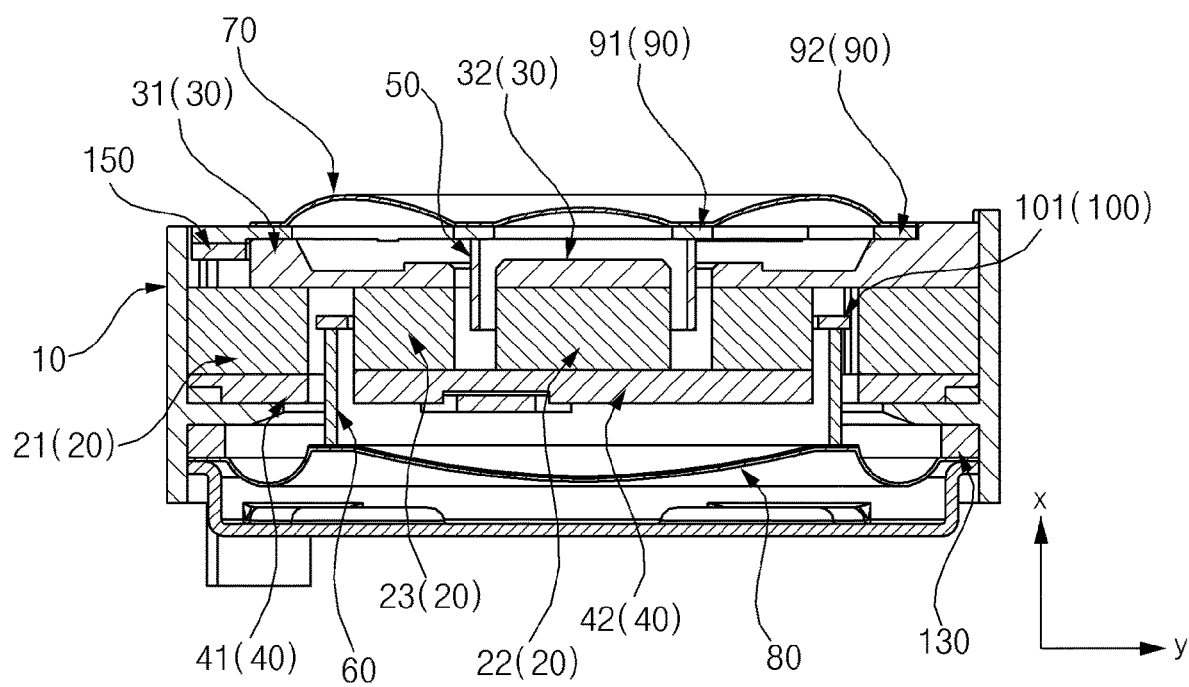
FIG. 1 is a side cross-sectional view of a speaker unit according to an embodiment.
Figure 2:
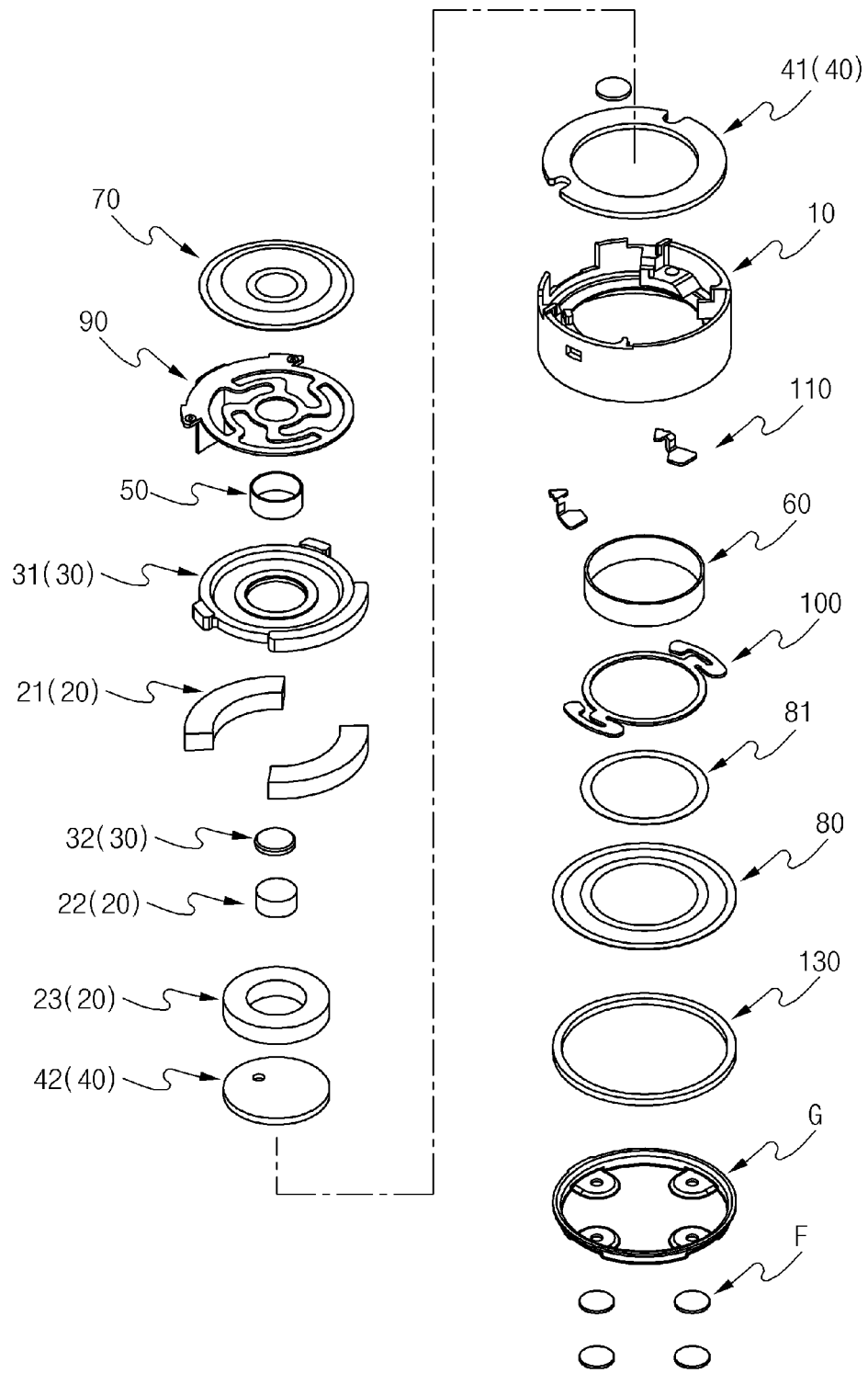
FIG. 2 is an exploded view illustrating the speaker unit shown in FIG. 1.

FIG. 1 is a side cross-sectional view of the speaker unit according to the embodiment, and FIG. 2 is an exploded view illustrating the speaker unit shown in FIG. 1.

Referring to FIGS. 1 and 2, in the following drawings, an X-axis indicates a front-rear direction of an earphone, and a Y-axis indicates a radial direction of the earphone. A forward direction refers to a direction in which a sound is emitted through a first diaphragm 70, and a rearward direction refers to a direction in which a sound is emitted through a second diaphragm.

The speaker unit according to the embodiment includes a component configured to reproduce a sound in a low-pitched range and a component configured to reproduce a sound in a high-pitched range (a two way type). Also, the speaker unit according to the embodiment has a feature in which a first flexible printed circuit board (FPCB) 90 of the component configured to reproduce the sound in the low-pitched range is separated from a second FPCB 100 of the component configured to reproduce the sound of the high-pitched range. The first FPCB 90 may support the first diaphragm 70 to be movable, and the FPCB 100 may support the second diaphragm 80 to be movable. Also, an area of the first FPCB 90 may be divided and a divided part may be overlapped with the first diaphragm 70 in a front-rear direction so as to secure a maximum size of the first diaphragm 70.

The speaker unit according to the embodiment may include a frame 10, a magnet 20, a first plate 30, a second plate 40, a first coil 50, a second coil 60, the first diaphragm 70, the second diaphragm 80, and the FPCB 90.

The frame 10 may be a cylindrical member.

The magnet 20 electromagnetically interacts with the first coil 50 and the second coil 60. The magnet 20 may include a first magnet 21, a second magnet 22, and a third magnet 23. The first magnet 21 may be disposed outside the second coil 60 and fixed to the frame 10. The second magnet 22 may be disposed inside the first coil 50. The third magnet 23 may be disposed between the first coil 50 and the second coil 60 in a radial direction (y direction).

On the basis of the radial direction (y direction) of the earphone, the second magnet 22 may be located innermost, the first magnet 21 may be located outermost, and the third magnet 23 may be disposed between the second magnet 22 and the first magnet 21.

The first magnet 21 may include a plurality of magnets 20 having a bent bar shape. The second magnet 22 may have a ring shape. The third magnet 23 may have a cylindrical shape.

The first magnet 21 and the third magnet 23 are configured to reproduce a sound in a low-pitched range, and the second magnet 22 and the third magnet 23 are configured to reproduce a sound in a high-pitched range.

The first plate 30 comes into contact with one surface of the magnet 20 to form a magnetic field. The first plate 30 may include a 1a plate 31 and a 1b plate 32. The 1a plate 31 may have a ring shape. The 1a plate 31 comes into contact with one surface of the first magnet 21 and one surface of the third magnet 23. The 1b plate 32 may have a disk shape. The 1b plate 32 comes into contact with one surface of the second magnet 22.

The second plate 40 comes into contact with the other surface of the magnet 20 to form a magnetic field. The second plate 40 may include a 2a plate 41 and a 2b plate 42. The 2a plate 41 may have an annular shape.

The 2a plate 41 comes into contact with the other surface of the first magnet 21. The 2b plate 42 may have a disk shape. The 2b plate 42 comes into contact with one surface of the second magnet 22 and the one surface of the third magnet 23.

The first coil 50 is fixed to the first diaphragm 70. When the first coil 50 moves, the first diaphragm 70 moves in connection therewith. The first coil 50 may be disposed between the second magnet 22 and the third magnet 23 in a radial direction. Also, the first coil 50 may be disposed between the 1a plate 31 and the 1b plate 32 in a radial direction. Accordingly, a part of the first coil 50 is disposed to be overlapped with the second magnet 22 and the third magnet 23 in the radial direction. Also, a part of the first coil 50 may be disposed to be overlapped with the first plate 30 in the radial direction. The first coil 50 may be configured to reproduce a sound in a high-pitched range.

The second coil 60 may be disposed outside the first coil 50 in a radial direction. Also, the second coil 60 may be disposed on one side of the first coil 50 in a front-rear direction. The second coil 60 is fixed to the second diaphragm 80. When the second coil 60 moves, the second diaphragm 80 moves in connection therewith. The second coil 60 may be disposed between the first magnet 21 and the third magnet 23 in a radial direction. Also, the second coil 60 may be disposed between the 2a plate 41 and the 2b plate 42 in a radial direction. Accordingly, a part of the second coil 60 is disposed to be overlapped with the first magnet 21 and the third magnet 23 in the radial direction. Also, a part of the second coil 60 may be disposed to be overlapped with the second plate 40 in the radial direction. The second coil 60 may be configured to reproduce a sound in a low-pitched range.

The first diaphragm 70 may be fixed to the first FPCB 90. The first diaphragm 70 may be configured to reproduce a sound in a high-pitched range.

The second diaphragm 80 may be fixed to a fixing ring 130. The fixing ring 130 may be fixed to a grill G, and the grill G may be fixed to the frame 10. A dome 81 may be disposed in a center of the second diaphragm 80. The second diaphragm 80 may be configured to reproduce a sound in a low-pitched range.

The first FPCB 90 supplies an electrical signal to the first coil 50 and the second coil 60. The first FPCB 90 may include a ductile material. A backup plate 150 configured to strength may be attached to the first FPCB 90.

A terminal 110 is disposed on the frame 10. The terminal 110 electrically connects the first FPCB 90 to the second FPCB 100.

A first tuning portion F1 may be disposed on the 2b plate 42. A second tuning portion F2 may be disposed on the grill G. The first tuning portion F1 and the second tuning portion F2 are configured to change a tone or sound quality, may be a mesh material, and may include polyester, nylon, nonwoven fabric, a membrane filter, and the like.

A magnetic field moves to a space between the first plate 30 and the second plate 40. When currents are applied to the first coil 50 and the second coil 60 so that the first coil 50 and the second coil 60 are magnetized, the first coil 50 and the second coil 60 move according to magnetic polarities of the first coil 50 and the second coil 60.

That is, when the magnetic polarity of the first coil 50 is equal to the magnetic polarity of the first plate 30, the first coil 50 is pushed and moved. That is, when the magnetic polarity of the second coil 60 is equal to the magnetic polarity of the second plate 40, the second coil 60 is pushed and moved. On the other hand, when the magnetic polarity of the first coil 50 differs from the magnetic polarity of the first plate 30, the first coil 50 is pulled and moved. That is, when the magnetic polarity of the second coil 60 differs from the magnetic polarity of the second plate 40, the second coil 60 is pulled and moved. As described above, the first diaphragm 70 and the second diaphragm 80 move and vibrate air so as to generate a sound.

Figure 3:
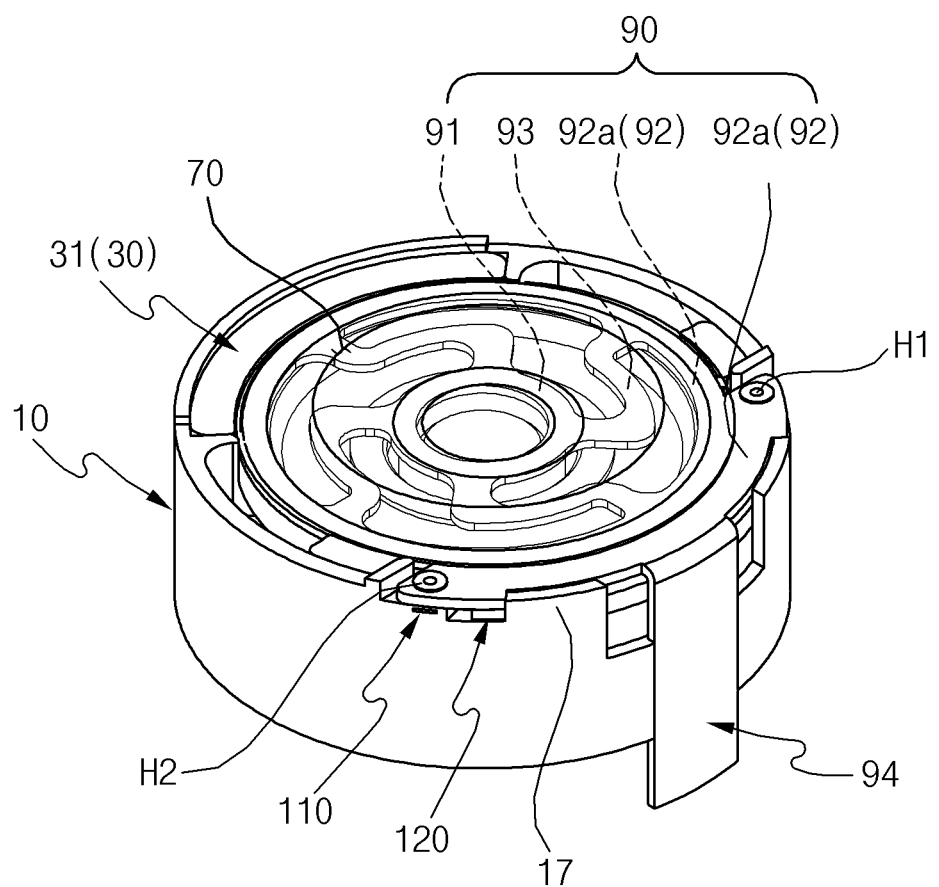
FIG. 3 is a view illustrating a state in which a part of a first flexible printed circuit board (FPCB) is disposed to be overlapped with a first diaphragm.
Figure 4:
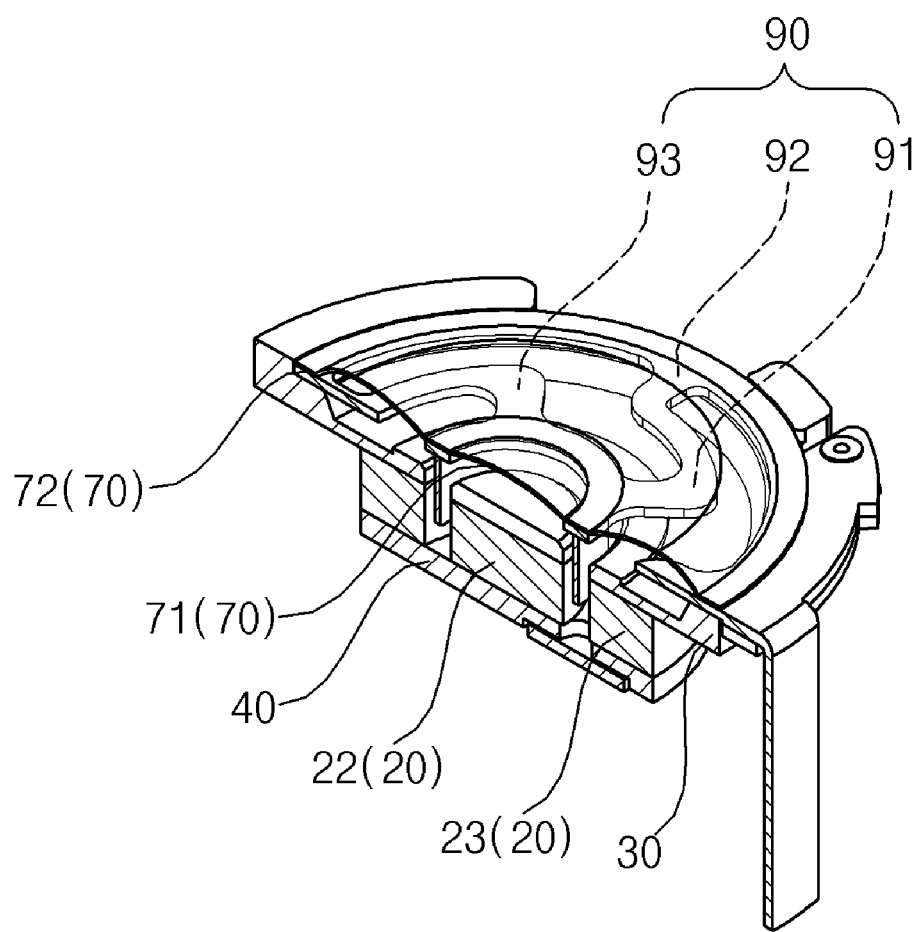
FIG. 4 is a side cross-sectional view illustrating the first FPCB.

FIG. 3 is a view illustrating a state in which a part of the first FPCB 90 is disposed to be overlapped with the first diaphragm 70, and FIG. 4 is a side cross-sectional view illustrating the first FPCB 90.

First areas 91 and 101 which will be described below refer to areas of the FPCBs 90 and 100 which are fixed to the diaphragms 70 and 80. Second areas 92 and 102 refer to areas of the FBPCs 90 and 100 which are connected to the frame 10, and third areas 93 and 103 refers to areas which connect the first areas 91 and 101 to the second areas 92 and 102, respectively.

Referring to FIGS. 3 and 4, in order to increase a radial size of the first diaphragm 70, a part of the first FPCB 90 is disposed below the first diaphragm 70. The first FPCB 90 may be divided into the first area 91, the second area 92, the third area 93, and an extension portion 94.

The first area 91 of the first FPCB 90 is coupled to a dome 71 of the first diaphragm 70. The first area 91 may be annularly disposed. Also, the first area 91 is disposed to be overlapped with the first diaphragm 70 in a front-rear direction (x direction).

The second area 92 is coupled to an edge portion 72 of the first diaphragm 70. The second area 92 may be annularly disposed. The second area 92 may be divided into a 2-1 area 92a and a 2-2 area 92b. The 2-1 area 92a is disposed to be overlapped with the first diaphragm 70 in the front-rear direction (x direction). The 2-2 area 92b is disposed outside the 2-1 area 92a and connected to the extension portion 94. Also, the 2-1 area 92a may be coupled to the 1a plate 31, and the 2-2 area 92b may be supported by the backup plate 120.

The third area 93 is a bridge type area configured to electrically connect the first area 91 to the second area 92.

The frame 10 may include a rob 17. The rib 17 protrudes from a top surface of the frame 10. The rib 17 is disposed to be radially overlapped with the backup plate 120 and the first FPCB 90. An end of the rib 17 may be disposed to be higher than the first FPCB 90. The rib 17 is configured to support the backup plate 120 and the first FPCB 90.

Referring to FIGS. 1 and 4, the first area 91 of the first FPCB 90 is connected to the first coil 50. For example, the dome 71 of the first diaphragm 70 may come into contact with a front surface of the first area 91, and the first coil 50 may come into contact with a rear surface of the first area 91.

Figure 5:
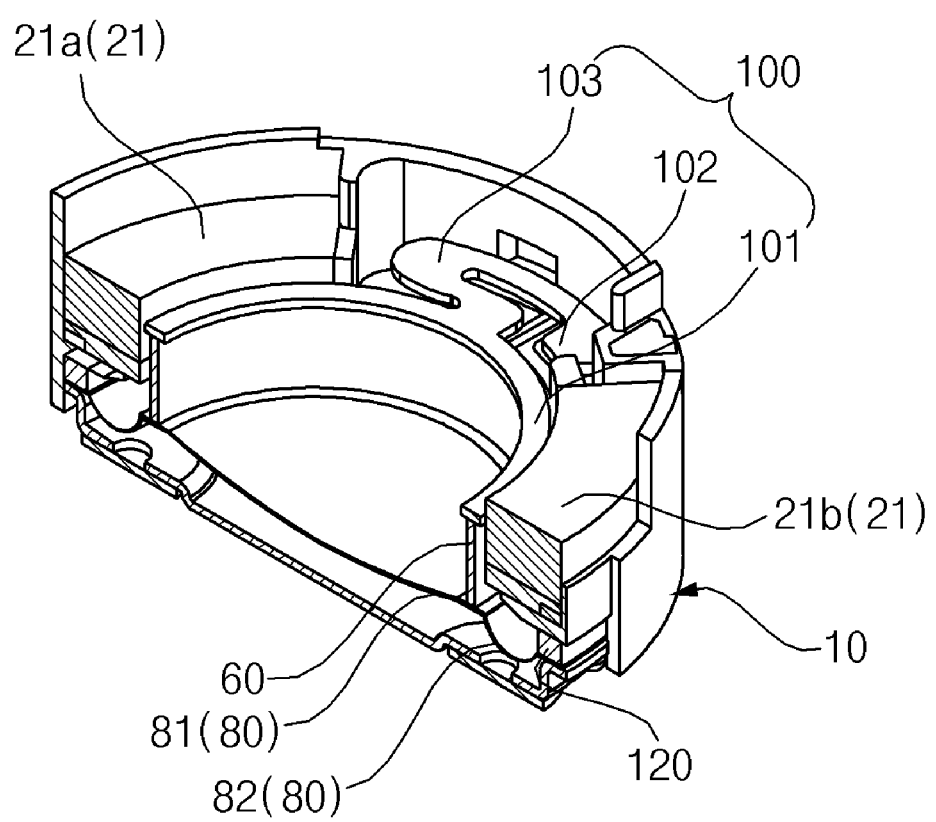
FIG. 5 is a side cross-sectional view illustrating a second FPCB.

FIG. 5 is a side cross-sectional view illustrating the second FPCB 100.

Referring to FIG. 5, the second FPCB 100 may be divided into the first area 101, the second area 102, and the third area 103. The first area 101 of the second FPCB 100 is coupled to the dome 81 of the second diaphragm 80. The first area 101 may be annularly disposed. Also, the first area 101 is disposed to be overlapped with the second diaphragm 80 in the front-rear direction (x direction). The second area 102 may be coupled to the terminal 110 (refer to FIG. 2) so as to be fixed to the frame 10. The third area 103 is a bridge type area configured to electrically connect the first area 101 to the second area 102.

Referring to FIGS. 1 and 5, the first area 101 of the second FPCB 100 is connected to the second coil 60. For example, one end of the second coil 60 may be coupled to the first area 101 and another end of the second coil 60 may be coupled to the dome 81 of the second diaphragm 80. An edge portion 82 of the second diaphragm 80 may be coupled to an additional fixing ring 130. The fixing ring 130 is fixed to the frame 10.

Figure 6:
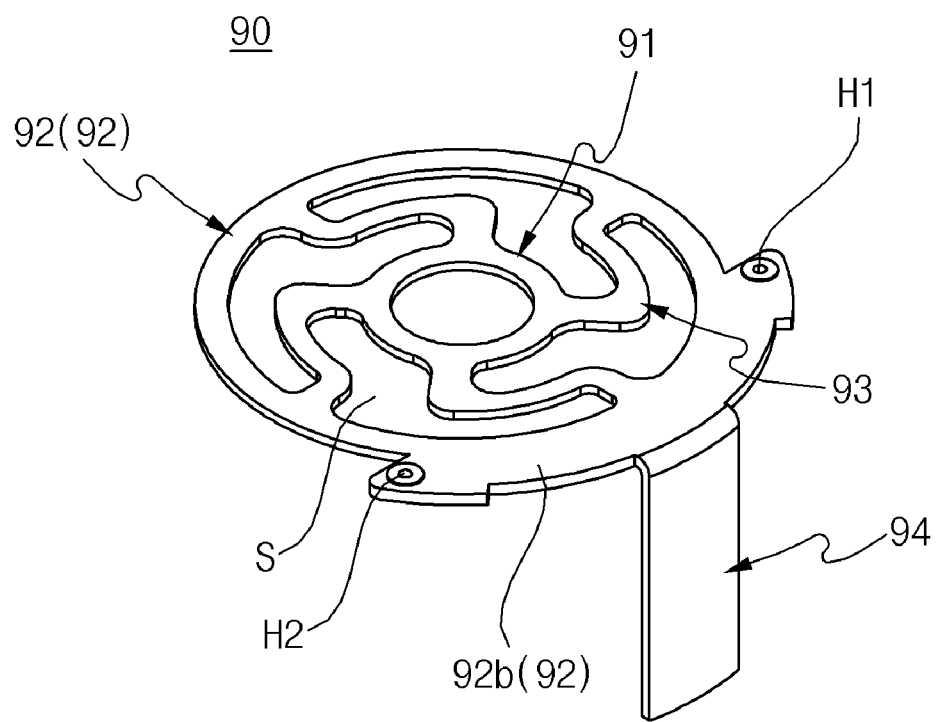
FIG. 6 is a perspective view illustrating the first FPCB.

FIG. 6 is a perspective view illustrating the first FPCB 90.

Referring to FIG. 6, the first area 91 is disposed inside the second area 92 in the radial direction. The first area 91 may have an annular shape. The 2-1 area 92a of the second area 92 may have an annular shape, and the 2-2 area 92b may have an arc shape. The extension portion 94 may be connected to the second area 92. The extension portion 94 may be bent from the second area 92 and disposed outside the frame 10. The extension portion 94 may be connected to an external signal line.

A plurality of such third areas 93 may be arranged. Each of the plurality of third areas 93 includes at least one bent area. For example, a connection position between the third area 93 and the first area 91 may differ from a connection position between the third area 93 and the second area 92 in a circumferential direction. The third area 93 may include two bent areas which are bent in different directions. Also, a space S may be between the third areas 93 adjacent to each other.

The third areas 93 support the first diaphragm 70 to be movable in the front-rear direction. When the first coil 50 moves in the front-rear direction due to the magnetic field, the first area 91 of the first FPCB 90 also moves in the front-rear direction. On the other hand, the second area 92 of the first FPCB 90 is fixed to the 1a plate 31 and consequently fixed to the frame 10. The third areas 93 connect the first area 91 moving in the front-rear direction to the second area 92 fixed to the frame 10 and not moved so as to provide a restoring force in the front-rear direction.

The 2-2 area 92b of the first FPCB 90 may include a first thermosetting portion H1 and a second thermosetting portion H2. The first thermosetting portion H1 and the second thermosetting portion H2 are configured to be electrically connected to the terminal 110.

Figure 7:
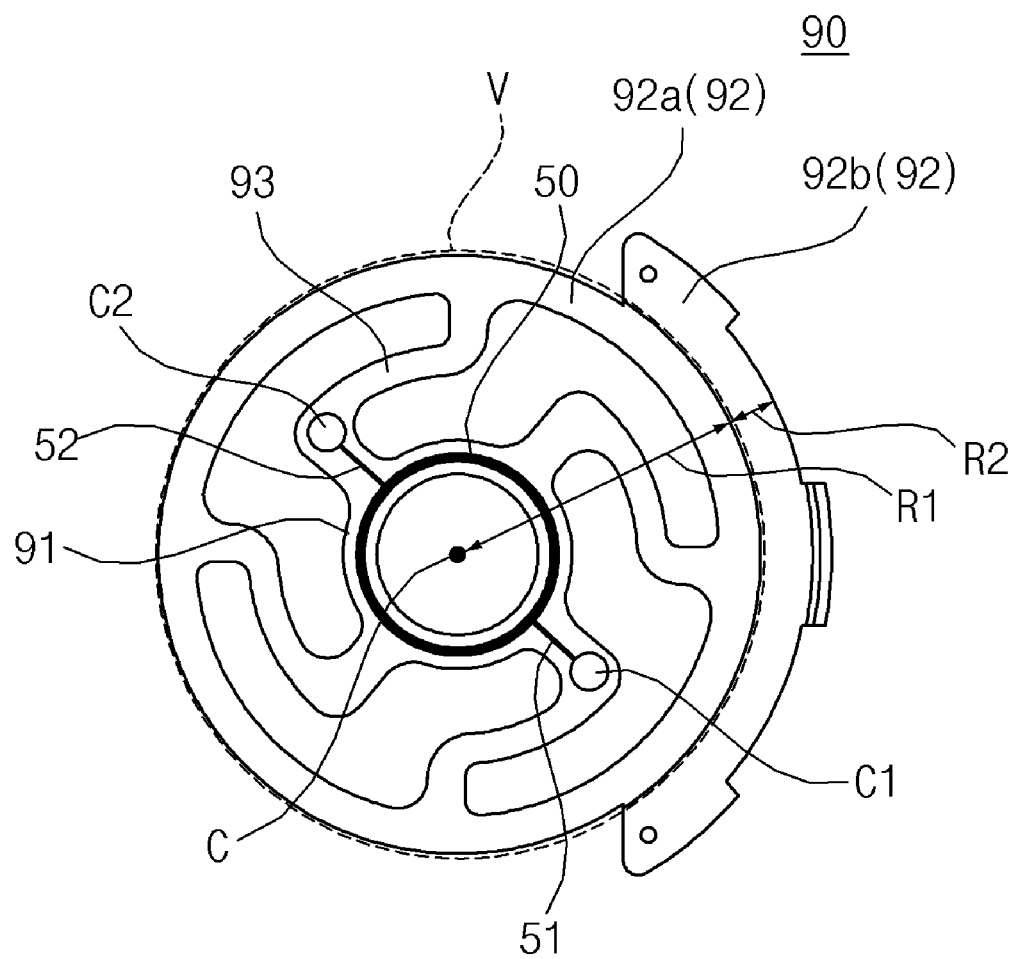
FIG. 7 is a bottom view illustrating the first FPCB.

FIG. 7 is a bottom view illustrating the first FPCB 90.

Referring to FIGS. 6 and 7, contact points C1 and C2 connected to lead wires 51 and 52 of the first coil 50, respectively, may be disposed in the third areas 93. The contact points C1 and C2 may include a first contact point C1 and a second contact point C2. The first contact point C1 is connected to a first lead wire 51 of the first coil 50, and the second contact point C2 is connected to a second lead wire 52 of the first coil 50. The first coil 50 may be connected to the contact points C1 and C2 through thermosetting. The first contact point C1 and the first contact point C2 may be disposed in the different third areas 93.

Since the first area 91 and the 2-1 area 92a of the first FPCB 90 are disposed below the first diaphragm 70, a radial width R2 of the 2-2 area 92b on the basis of a center C of the speaker unit may be reduced significantly. V shown in FIG. 7 is a virtual line which refers to an outer edge of the first diaphragm 70. Since a radial width R1 of the first diaphragm 70 may be increased according to the reduction in the radial width R2 of the 2-2 area 92b, a volume of a sound and a range of a sound may be increased.

Figure 8:
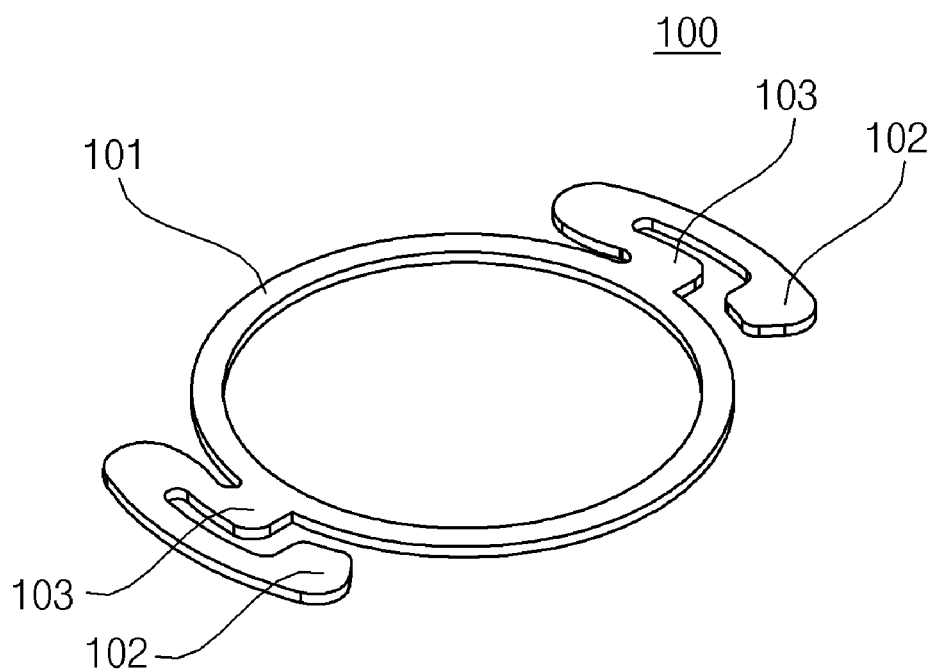
FIG. 8 is a perspective view illustrating the second FPCB.

FIG. 8 is a perspective view illustrating the second FPCB 100.

Referring to FIG. 8, the first area 101 is disposed inside the second area 92 in the radial direction. The first area 101 may have an annular shape. The second area 102 is coupled to the terminal 110 disposed on the frame 10. In order to secure an adequate contact area with the terminal 110, a shape and a size of the second area 102 may be set in consideration of a shape of the terminal 110.

Two third areas 103 may be disposed. Each of the third areas 103 includes at least one bent area. For example, a connection position between the third area 103 and the first area 101 may differ from a connection position between the third area 103 and the second area 102 in a circumferential direction. The third area 103 may include two bent areas which are bent in different directions.

The third areas 103 support the second diaphragm 80 to be movable in the front-rear direction. When the second coil 60 moves in the front-rear direction due to the magnetic field, the first area 101 of the second FPCB 100 also moves in the front-rear direction. On the other hand, the second area 102 of the second FPCB 100 is fixed to the terminal 110 and consequently fixed to the frame 10. The third areas 103 connect the first area 101 moving in the front-rear direction to the second area 102 fixed to the frame 10 and not moved so as to provide a restoring force in the front-rear direction.

Figure 9:
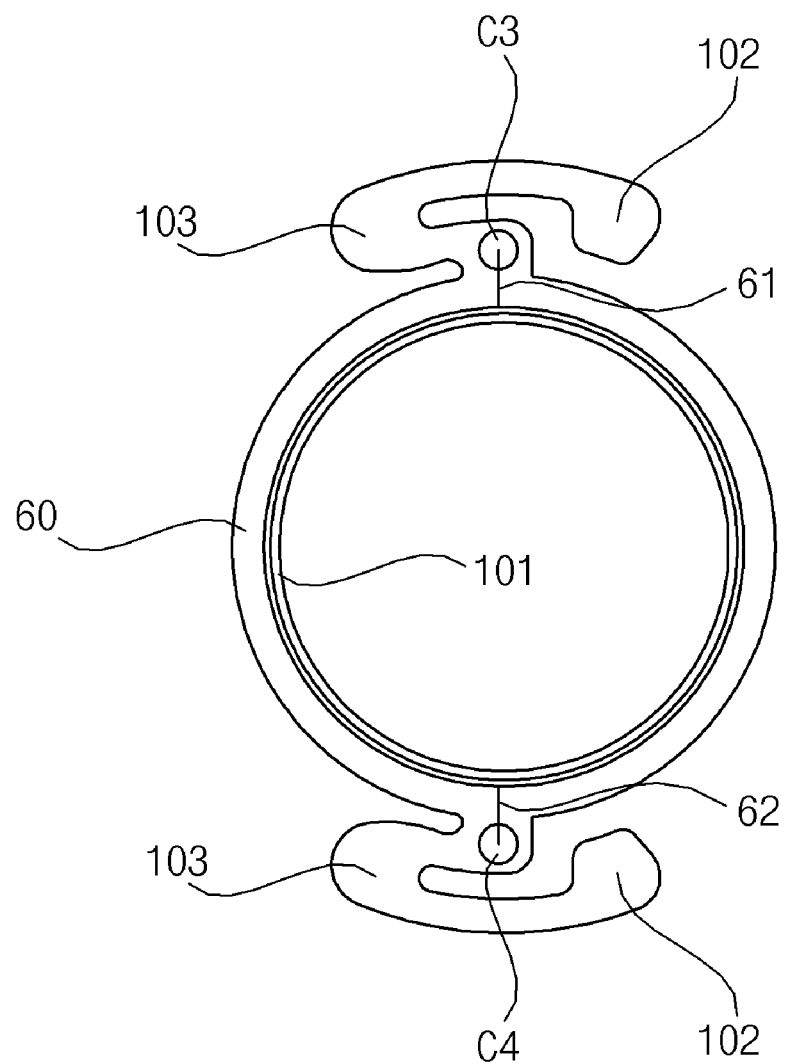
FIG. 9 is a bottom view illustrating the second FPCB.

FIG. 9 is a bottom view illustrating the second FPCB 100.

Referring to FIGS. 8 and 9, contact points C3 and C4 connected to lead wires 61 and 62 of the second coil 60, respectively, may be disposed in the third areas 103. The contact points C3 and C4 may include a third contact point C3 and a fourth contact point C4. The third contact point C3 is connected to a third lead wire 61 of the second coil 60, and the fourth contact point C2 is connected to a fourth lead wire 62 of the second coil 60. The second coil 60 may be connected to the contact points C3 and C4 through thermosetting. The third contact point C3 and the fourth contact point C4 may be disposed in the different third areas 103.

Figure 10:
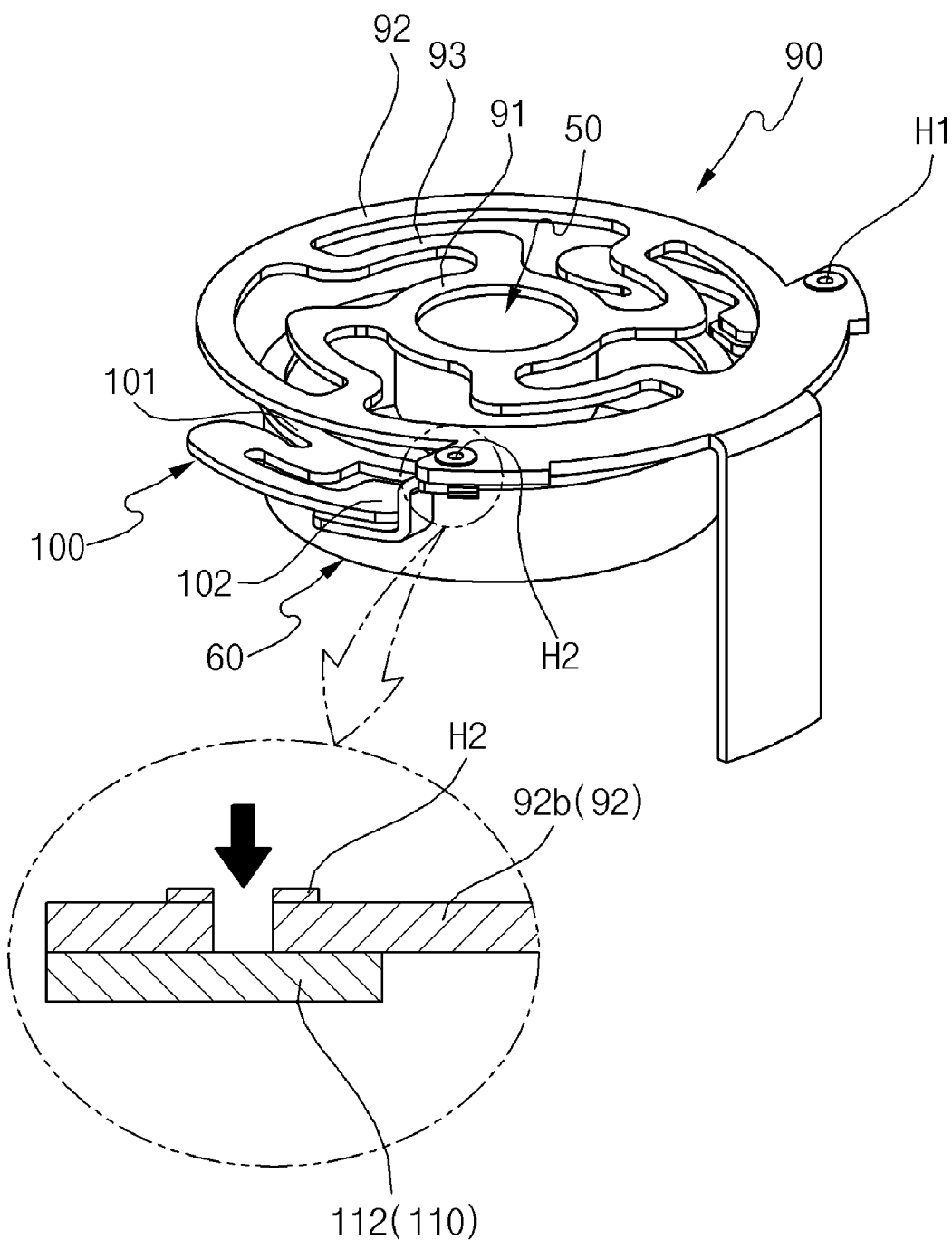
FIG. 10 is a view illustrating a connection state between a terminal and the first FPCB.

FIG. 10 is a view illustrating a connection state between the terminal and the first FPCB 90.

Referring to FIG. 10, the first FPCB 90 and the second FPCB 100 may be electrically connected to each other through the terminal 110.

A conductive thermosetting material is applied to a hole passing through a top surface and a bottom surface of the 2-2 area 92b and a periphery of the hold in each of the first thermosetting portion H1 and the second thermosetting portion H2. When heat and pressure are applied to the first thermosetting portion H1 and the second thermosetting portion H2, a thermosetting material may be melted and may come into contact with the terminal 110 in contact with a bottom surface of the 2-2 area 92b through the hole so as to electrically connect the first FPCB 90 to the terminal 110. The terminal 110 and the second area 102 of the second FPCB 90 are fused to be electrically connected to each other.

Figure 11:
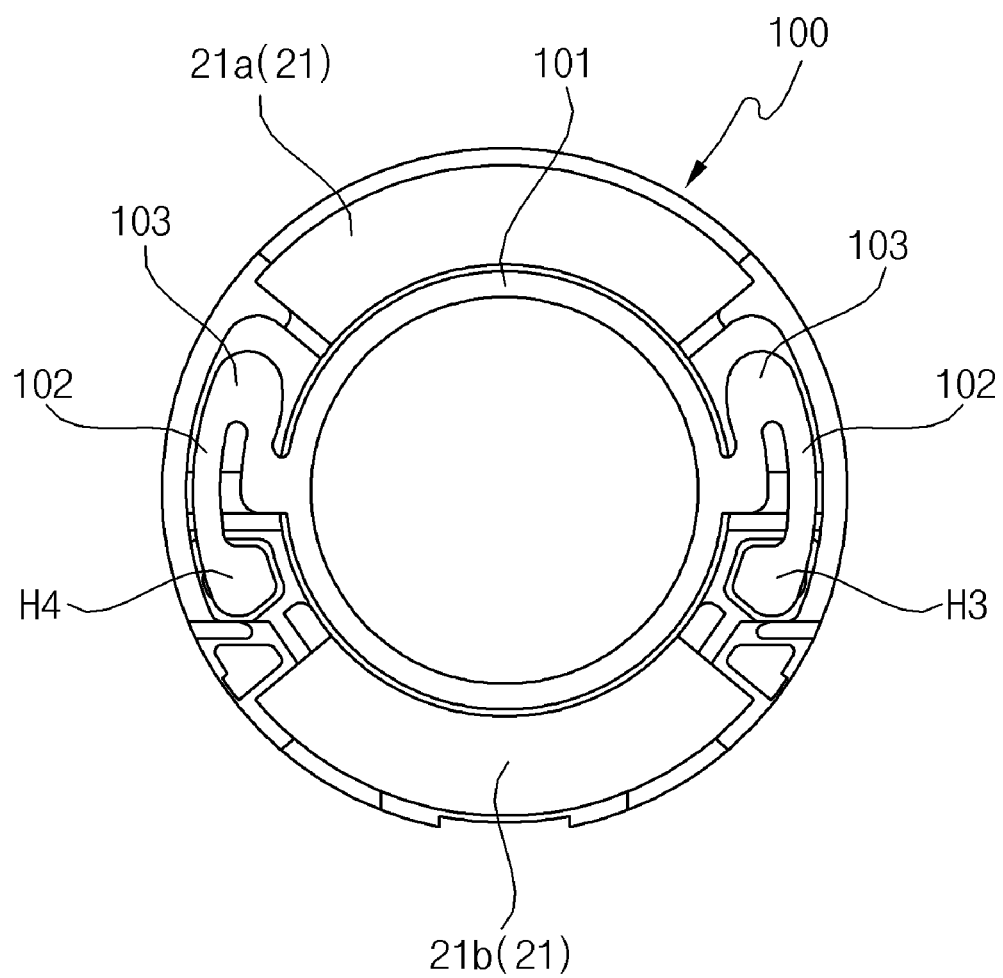
FIG. 11 is a view illustrating an internal state of a frame on which the second FPCB is mounted.
Figure 12:
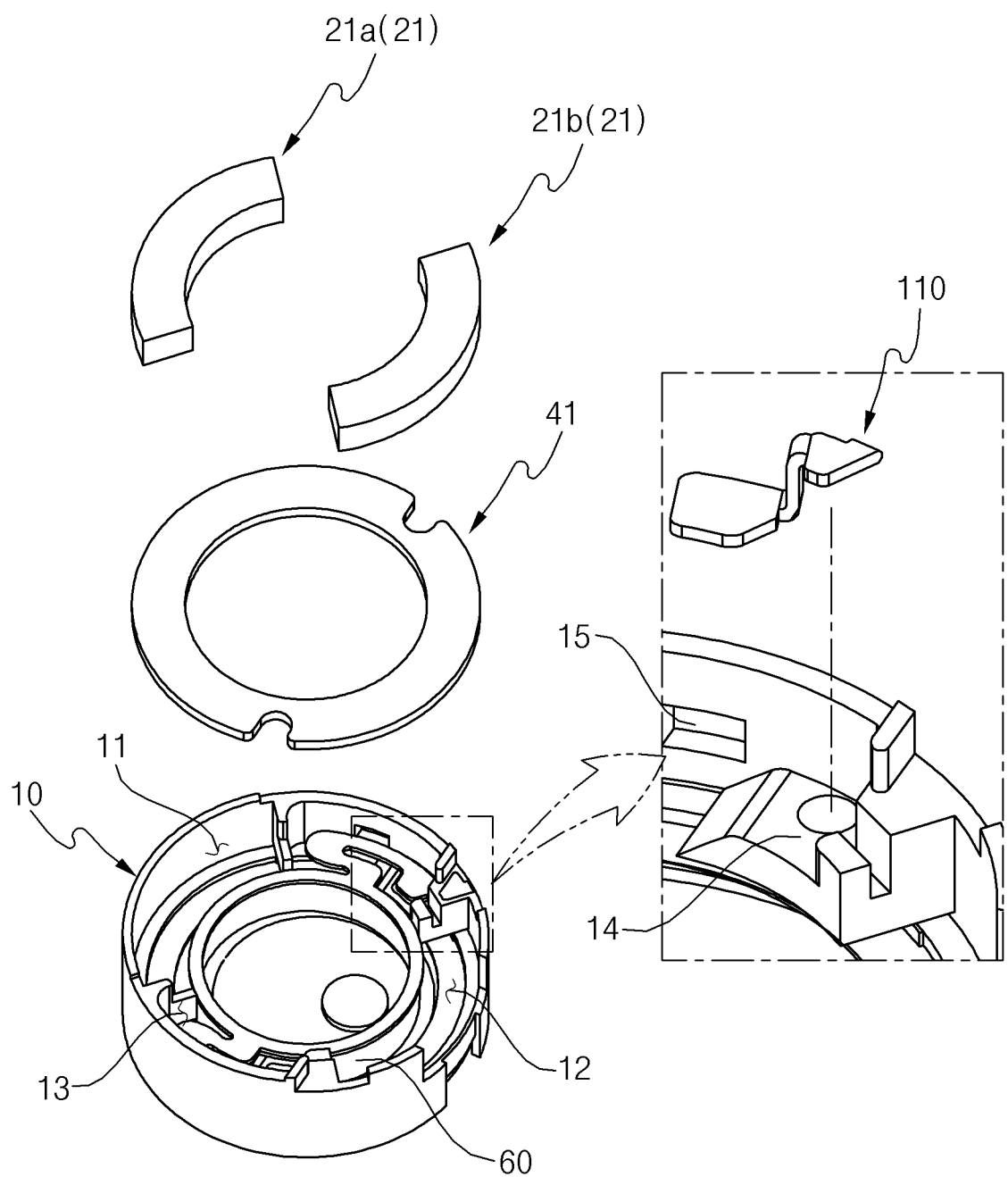
FIG. 12 is an exploded view of the frame shown in FIG. 11.

FIG. 11 is a view illustrating an internal state of the frame 10 on which the second FPCB 100 is mounted, and FIG. 12 is an exploded view illustrating the frame 10 shown in FIG. 11.

Referring to FIGS. 11 and 12, two terminals 110 may be mounted on the frame 10. The terminals 110 may be disposed outside the second coil 60.

The first magnet 21 is mounted on the frame 10. The first magnet 21 may include a 1a magnet 21a and a 1b magnet 21b. Each of the 1a magnet 21a and the 1b magnet 21b may be an arc-shaped bar. The 1a magnet 21a and the 1b magnet 21b are disposed to be spaced apart in a circumferential direction. The shapes and positions of the 1a magnet 21a and the 1b magnet 21b are configured to secure spaces of the second area 102 and the third area 103 of the second FPCB 100.

The second area 102 and the third area 103 of the second FPCB 100 are located between the 1a magnet 21a and the 1b magnet 21b in the circumferential direction.

The frame 10 may include a first accommodation portion 11, a second accommodation portion 12, and a third accommodation portion 13. The first accommodation portion 11 and he second accommodation portion 12 may be disposed to be spaced apart from each other with the third accommodation portion 13 in the circumferential direction.

The 2a plate 41 may be disposed below the 1a magnet 21a and the 1b magnet 21b. The 2a plate 41 may be disposed annularly unlike the 1a magnet 21a and the 1b magnet 21b so as to secure an adequate magnetic field force. The 2a plate 41 may be disposed over all of the first accommodation portion 11, the second accommodation portion 12, and the third accommodation portion 13.

The 1a magnet 21a is mounted on the first accommodation portion 11. The 1b magnet 21b is mounted on the second accommodation portion 12. The second area 102 and the third area 103 of the second FPCB 100 are disposed between the terminals 110 and the two third accommodation portions 13.

Meanwhile, the frame 10 includes a terminal mounting portion 14 on which the terminal 110 is mounted. The terminal mounting portion 14 may be mounted on the third accommodation portion 13. The terminal mounting portion 14 may be formed in a partition of the frame 10 to be concave so as to secure a space through which a part of the terminal 110 passes. The terminal mounting portion 14 may be disposed on a side surface of the third accommodation portion 13 in the circumferential direction in consideration of the second area 102 and the third area 103 of the second FPCB 100.

A hole 15 for barometric equilibrium may be formed in a sidewall of the frame 10. The hole 15 may be formed to pass through an inner surface and an outer surface of the sidewall of the frame 10 which form the third accommodation portion 13.

Figure 13:
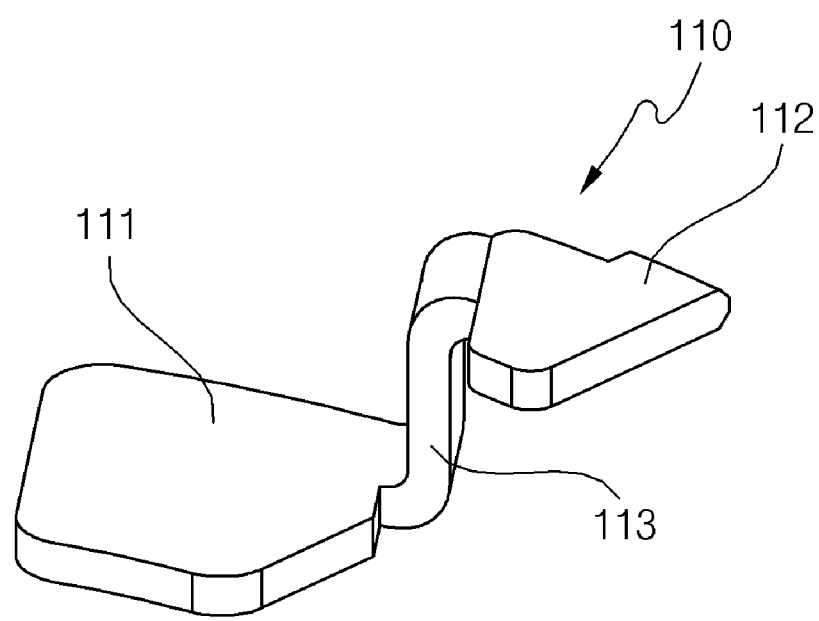
FIG. 13 is a perspective view illustrating the terminal.

FIG. 13 is a perspective view illustrating the terminal.

Referring to FIG. 13, the terminal 110 may include a first body 111, a second body 112, and a connection portion 113. The first body 111 is a place to be melted with the second area 102 of the second FPCB 100. The first body 111 has a plane which comes in contact with the second area 102. The second body 112 is a place which comes into contact with the first thermosetting portion H1 or the second thermosetting portion H2 of the first FPCB 90. The second body 112 has a plane which comes in contact with the first FPCB 90. The first body 111 and the second body 112 are disposed at different heights. The connection portion 113 connects the first body 111 to the second body 112 so as to maintain a certain height difference between the first body 111 and the second body 112.

Figure 14:
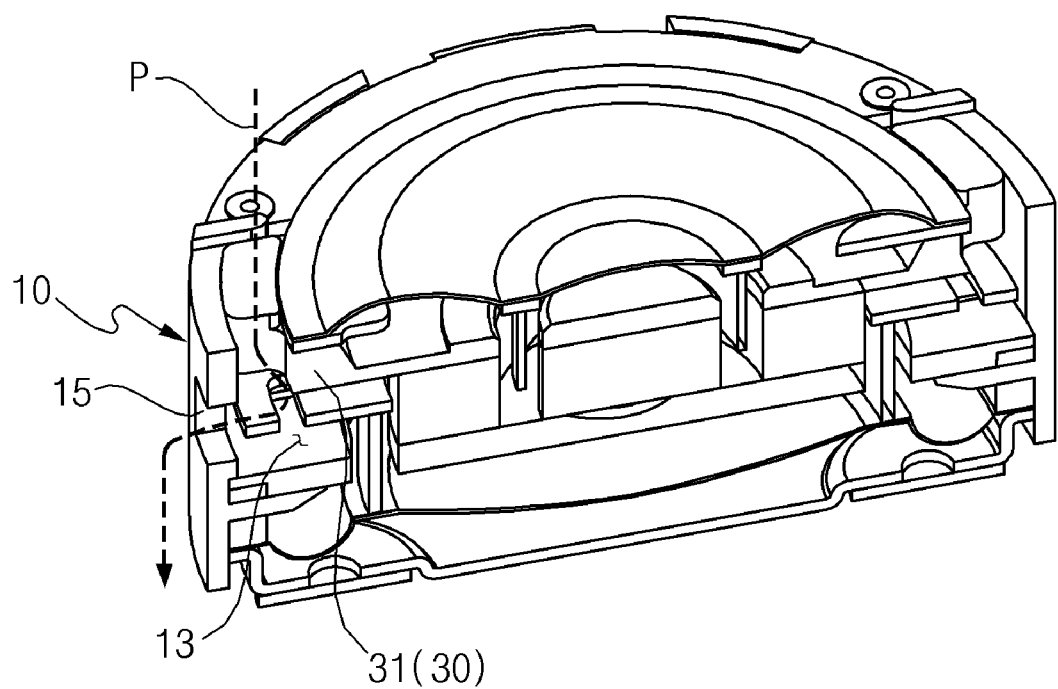
FIG. 14 is a view illustrating a path for forming barometric equilibrium.

FIG. 14 is a view illustrating a path for forming barometric equilibrium.

Referring to FIG. 14, a path P for barometric equilibrium may be formed through the hole 15 disposed in the third accommodation portion 13 of the frame 10. A front of the third accommodation portion 13 communicates with an eartip of the earphone. Since the third accommodation portion 13 communicates with an external space of the frame 10 through the hole 15, a pressure inside an ear of a user may be released.

Figure 15:
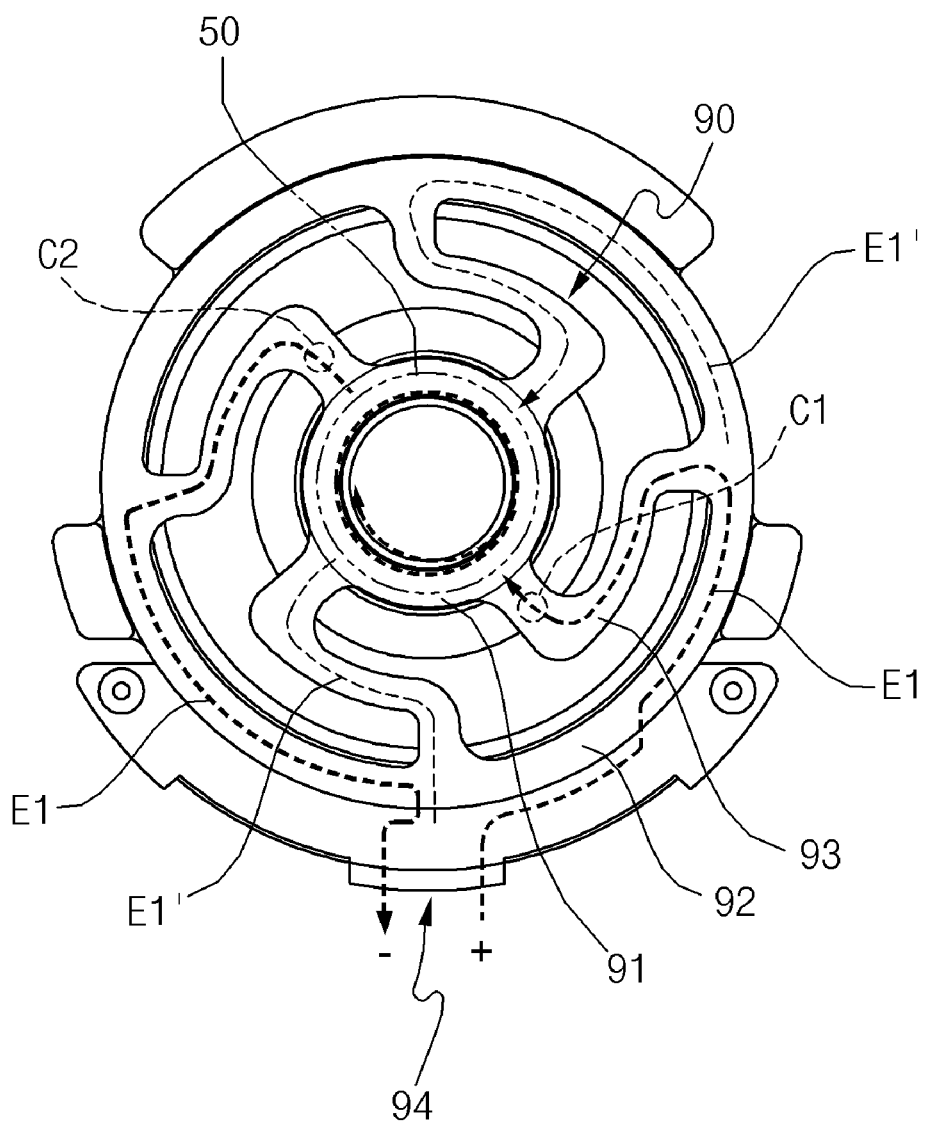
FIG. 15 is a view illustrating a flow of currents flowing through a first coil configured to reproduce a sound in a high-pitched range.

FIG. 15 is a view illustrating a flow of currents flowing through the first coil 50 to reproduce a sound in a high-pitched range.

Referring to FIG. 15, in order to reproduce the sound in the high-pitched range, a path E1 of currents flowing through the first coil 50 is formed. A current flow from an external signal line to the first contact point C1 via the second area 92 and the third area 93 of the first FPCB 90 is formed through the extension portion 94. Also, the current flow is formed from the first contact point C1 to the second contact point C2 via the first coil 50. Also, the current flow is formed from the second contact point C2 to the external signal line via the first area 92, the third area 93, and the second area 92 through the extension portion 94.

When the first contact point C1 and the second contact point C2 are disposed in another third area 93 of the first FPCB 90, a path E1' of currents flowing through the first coil 50 may vary.

Figure 16:
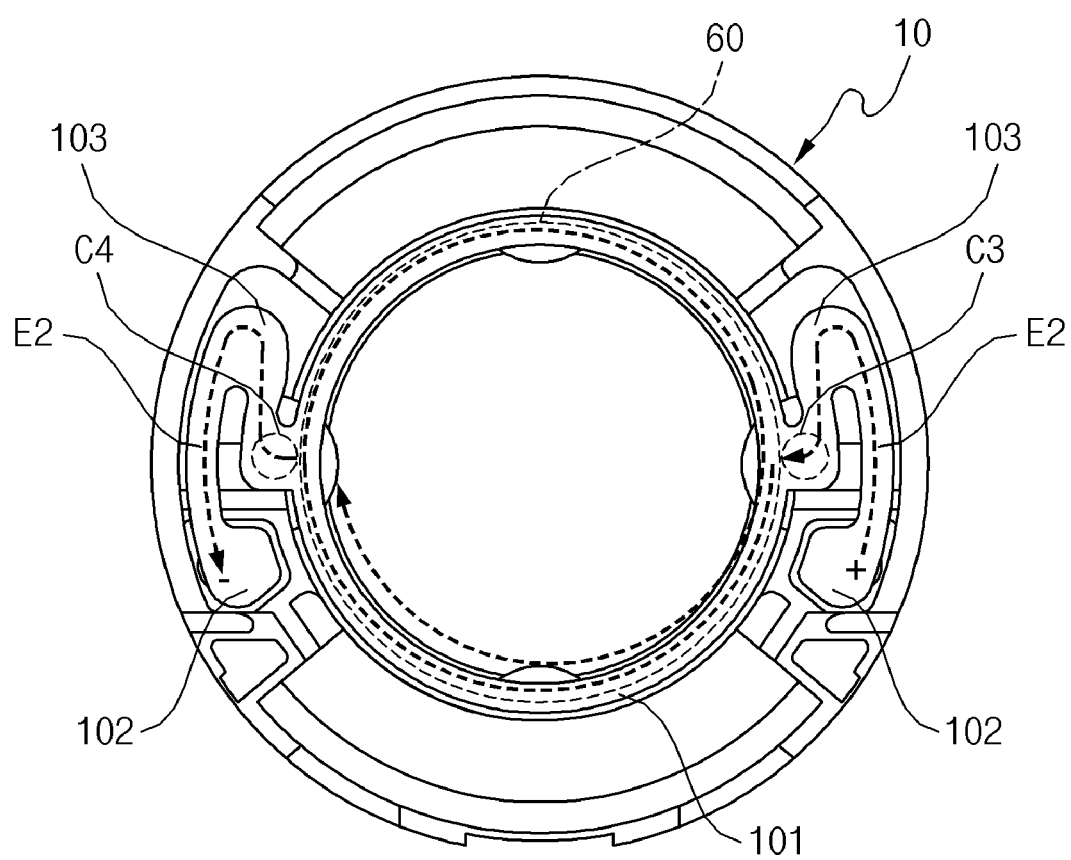
FIG. 16 is a view illustrating a flow of currents flowing from a second coil configured to reproduce a sound in a low-pitched range to the terminal through the second FPCB.
Figure 17:
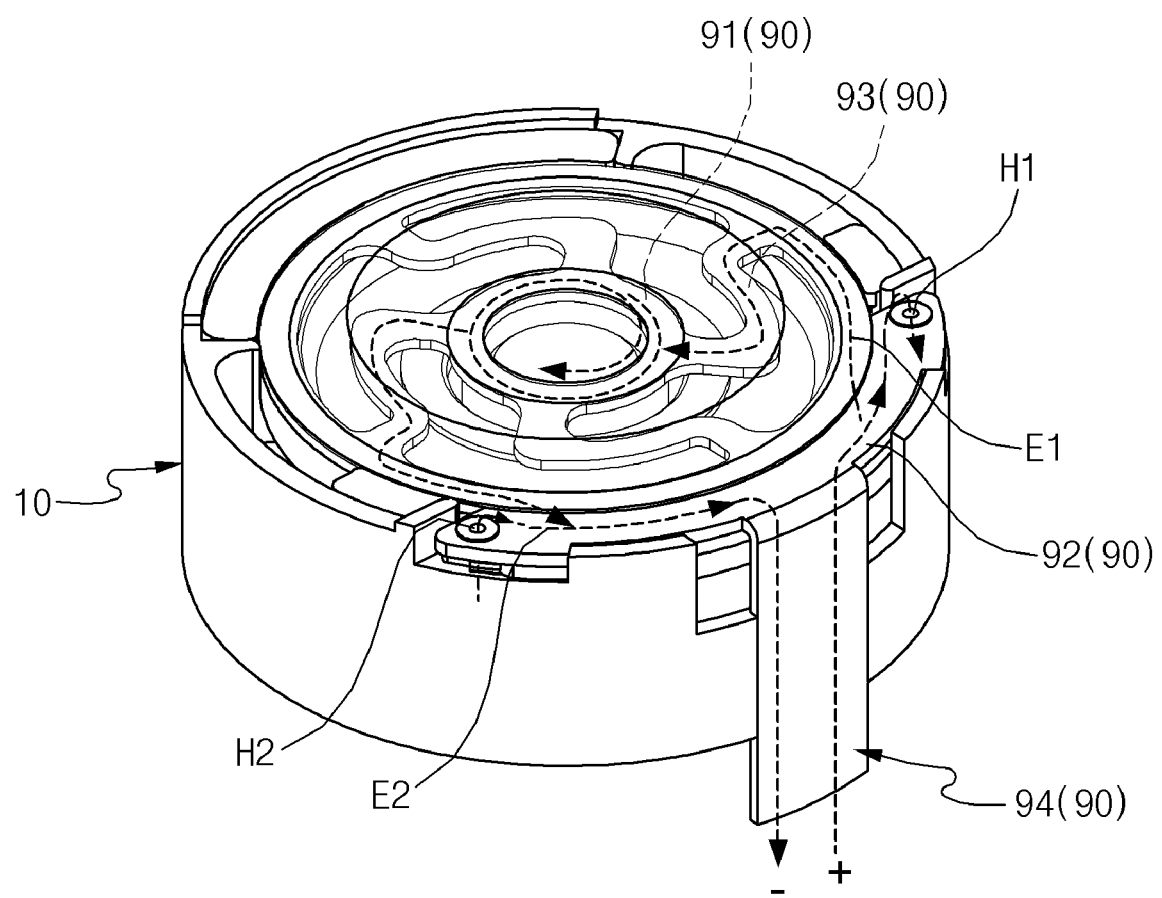
FIG. 17 is a view illustrating a flow of currents flowing from the first FPCB to the second FPCB.

FIG. 16 is a view illustrating a flow of currents flowing from the second coil 60 to the terminal 110 through the second FPCB 100 to reproduce a sound in a low-pitched range, and FIG. 17 is a view illustrating a flow of currents flowing from the first FPCB 90 to the second FPCB 100.

Referring to FIGS. 15 to 17, in order to reproduce the sound in the low-pitched range, a path E2 of currents flowing through the second coil 60 is formed. A current flow from the external signal line to the terminal 110 via the first thermosetting portion H1 of the second area 92 is formed through the extension portion 94. Also, a current flow from the terminal 110 to the third contact point C3 via the second area 102 and the third area 103 of the second FPCB 100 is formed. A current flow from the third contact point C3 to the second area 102 via the second coil 60 is formed through the fourth contact point C4. A current flow from the second area 102 to the external signal line via the second area 92 and the extension portion 94 of the first FPCB 90 is formed through the terminal 110.

Figure 18:
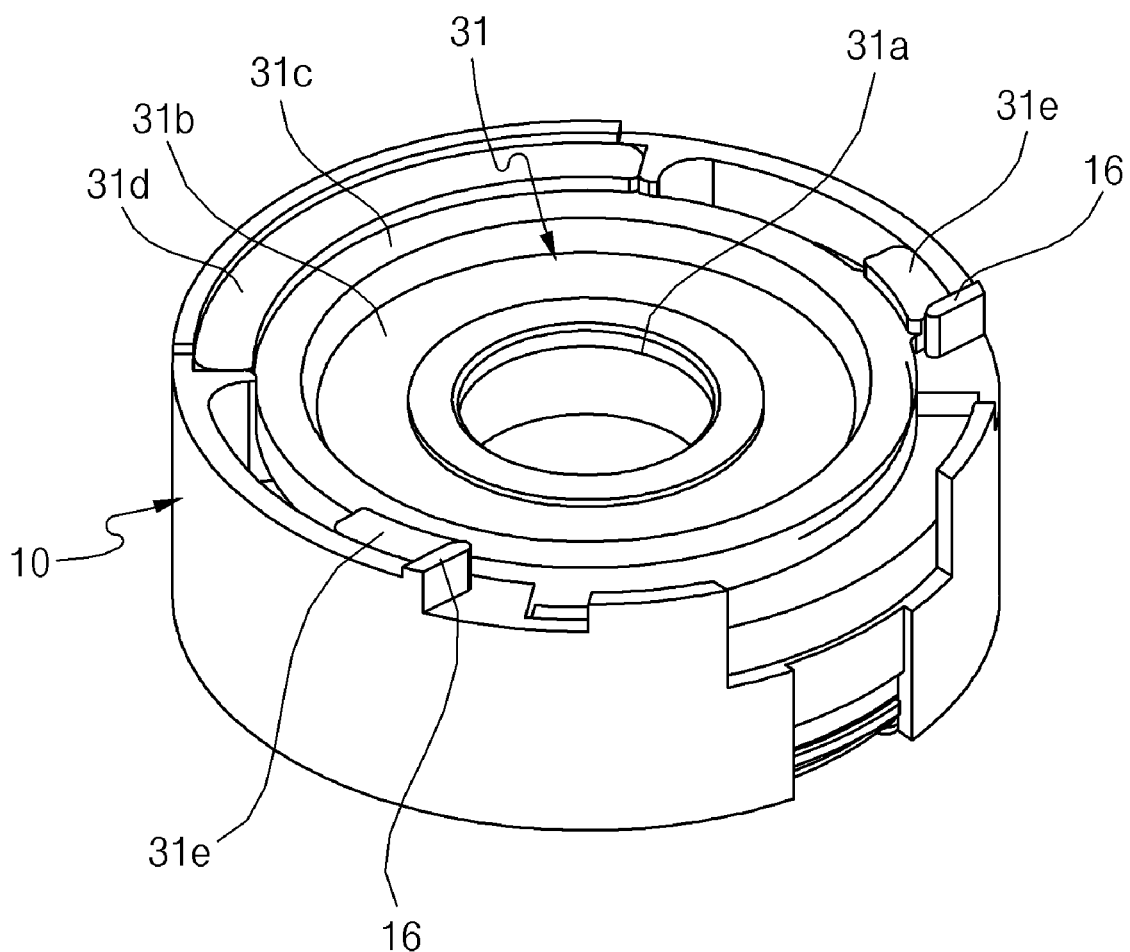
FIG. 18 is a view illustrating a coupling state between a 1a plate and the frame.

FIG. 18 is a view illustrating a state in which the 1a plate 31 and the frame 10 are coupled to each other.

Referring to FIG. 18, the 1a plate 31 may be a circular plate. The 1a plate 31 may include a base 31b in which a hole 31a is disposed to be located in a center. The first coil 50 is located inside the hole 31a. Also, the 1a plate 31 may include a first extension portion 31c and a second extension portion 31d. The first extension portion 31c radially extends from the base 31b. Also, the first extension portion 31c may be disposed to be stepwise from the base 31b. The first extension portion 31c is annularly disposed, and the second area 92 of the first FPCB 90 comes into contact with a top surface of the first extension portion 31c.

The second extension portion 31d radially extends from the first extension portion 31c. Also, the second extension portion 31d may be disposed to be stepwise from the first extension portion 31c. The second extension portion 31d is disposed annularly and be disposed outside the second area 92 of the first FPCB 90. The second extension portion 31d may come into contact with the frame 10.

Meanwhile, the 1a plate 30 may include a first guide 31e. The first guide 31e may be formed to radially protrude from an outer edge of the first plate 30. A plurality of such first guides 31e may be arranged along a circumference of the first plate 30. The first guide 31e may come into contact with an inner wall of the frame 10 and may align positions of components configured to reproduce a sound in a high-pitched range, that is, the first coil 50, the first diaphragm 70, the second magnet 22, the third magnet 23, the first FPCB 90, and the like.

According to the embodiments, a size of a diaphragm may be secured by reducing a size of a backup plate so as to provide an advantageous effect of increasing a volume and a reproduction range of a sound.

According to the embodiments, a magnet may be divided and disposed and an annular plate may be formed so as to provide an advantageous effect of securing an adequate force of a magnetic field.

According to the embodiments, an advantageous effect of stably supporting a first FPCB using a rib of a frame disposed to be higher than the first FPCB in a speaker unit configured to reproduce a sound in a high-pitched range may be provided.

According to embodiments, an advantageous effect of implementing barometric equilibrium by forming holes in a partial area of a second FPCB and in a third accommodation portion of the frame on which a terminal is disposed, in a speaker unit configured to reproduce a sound in a low-pitched range may be provided.

As described above, the speaker unit according to one exemplary embodiment of the present invention has been described in detail.

It should be noted that the above-described one embodiment of the present invention is merely an example in all aspects and is not intended to be limitative, and the scope of the present invention will be defined by the following claims rather than the above detailed description. Also, it should be construed that all changeable or modifiable shapes derived from the meaning and scope of the claims and equivalents thereof are included in the scope of the present invention.

What is claimed is:

1. A speaker unit for an earphone, the speaker unit comprising:
    a frame;
    a magnet;
    a first plate fixed to the frame and coming into contact with the magnet;
    a second plate;
    a first diaphragm;
    a second diaphragm;
    a first coil;
    a second coil;
    a first flexible printed circuit board (FPCB); and
    a second FPCB,
    wherein the first FPCB comprises a first area fixed to the first diaphragm, a second area connected to the frame, and a plurality of third areas configured to connect the first area of the first FPCB to the second area of the first FPCB,
    wherein at least one of the third areas of the first FPCB comprises a contact point connected to the first coil,
    wherein the third areas of the first FPCB each comprise at least one bent area, and a space is disposed between the third areas of the first FPCB adjacent to each other,
    wherein the second FPCB comprises a first area, a second area, and a plurality of third areas configured to connect the first area of the second FPCB to the second area of the second FPCB,
    wherein the first plate comes into contact with one side of the magnet and the second plate comes into contact with another side of the magnet,
    wherein the first diaphragm is disposed in front of the first plate and the second diaphragm is disposed in the rear of the second plate,
    wherein the first coil is disposed to be radially overlapped with the magnet and the first plate,
    wherein the second coil is disposed to be radially overlapped with the magnet and the second plate,
    wherein the first area of the first FPCB is connected to the first coil, and the first area of the second FPCB is connected to the second coil,
    wherein the first FPCB supports the first diaphragm to be movable, and
    wherein the second FPCB supports the second diaphragm to be movable.

2. The speaker unit of claim 1, wherein the first area of the first FPCB comes into contact with the first diaphragm and the first coil, and
    wherein the first area of the second FPCB comes into contact with the second coil.

3. The speaker unit of claim 1, wherein the first area of the first FPCB is fixed to a dome portion of the first diaphragm, and a part of the second area of the first FPCB is fixed to an edge portion of the first diaphragm, and
    wherein the first area of the second FPCB is fixed to a dome portion of the second diaphragm, and the second area of the second FPCB is fixed to a terminal disposed on the frame.

4. The speaker unit of claim 1, further comprising a terminal disposed on the frame and configured to electrically connect the first FPCB to the second FPCB.

5. The speaker unit of claim 1, wherein the contact point is a first contact point,
    wherein the first contact point is disposed in the at least one of the third areas of the first FPCB and connected to a lead wire of the first coil, and
    wherein a second contact point is disposed in at least one of the third areas of the third areas of the second FPCB and connected to a lead wire of the second coil.

6. The speaker unit of claim 4, wherein a connection area between the first FPCB and the terminal is radially disposed outside the first diaphragm.

7. The speaker unit of claim 1, wherein the first plate comprises a base comprising a hole in which the first coil is located, a first extension portion radially extending from the base, and a second extension portion radially extending from the first extension portion,
    wherein the first extension portion is disposed to be stepwise from the base and comes into contact with the second area of the first FPCB, and
    wherein the second extension portion is disposed to be stepwise from the first extension portion and disposed outside the second area of the first FPCB to come into contact with the frame.

8. The speaker unit of claim 1, further comprising a backup plate stacked on the frame,
    wherein the second area of the second FPCB is stacked and disposed on the backup plate,
    wherein the frame comprises a rib protruding from a top end thereof, and
    wherein the rib is disposed to be radially overlapped with the backup plate and the second FPCB.

9. The speaker unit of claim 1, wherein the frame comprises a first accommodation portion and a second accommodation portion which are disposed to be spaced apart along a circumferential direction and a third accommodation portion disposed between the first accommodation portion and the second accommodation portion,
    wherein the magnet is disposed on each of the first accommodation portion and the second accommodation portion, and
    wherein the second area and the third areas of the second FPCB are disposed on the third accommodation portion.

10. The speaker unit of claim 9, wherein the frame comprises a hole passing through an inner surface and an outer surface of the frame, and
    wherein the hole allows the third areas of the second FPCB to communicate with an external space of the frame so as to form a path for barometric equilibrium.

* * * * *